United States Patent [19]

Asaba et al.

[11] 3,977,783
[45] Aug. 31, 1976

[54] EXPOSURE DEVICE

[75] Inventors: Shuji Asaba, Fujisawa; Takeo Sato, Yokohama; Kadode Okumura, Fukaya, all of Japan

[73] Assignee: Tokyo Shibaura Electric Co., Ltd., Kawasaki, Japan

[22] Filed: June 27, 1975

[21] Appl. No.: 591,153

[30] Foreign Application Priority Data
July 5, 1974  Japan.............................. 49-77667
July 5, 1974  Japan.............................. 49-77669

[52] U.S. Cl.................................. 355/64; 355/75; 355/102; 271/258; 226/32; 226/141
[51] Int. Cl.²................... G03B 27/52; G03B 27/62; B65H 7/02; B65H 17/26
[58] Field of Search ................ 355/64, 75, 99, 122, 355/76, 78, 79, 97, 99, 102, 95, 96; 271/256, 258, 259; 354/1; 226/24, 32, 33, 38, 120, 124, 139, 140, 141, 152

[56] References Cited
UNITED STATES PATENTS 3,073,591  1/1963  Cosentino...................... 226/141 X
3,320,867  5/1967  Miller .............................. 355/99 X
3,713,571  1/1973  Simonton......................... 226/32 X
3,726,590  4/1973  Kistner et al. .................. 355/102 X

*Primary Examiner*—L. T. Hix
*Assistant Examiner*—Steven M. Pollard
*Attorney, Agent, or Firm*—Cushman, Darby & Cushman

[57]  ABSTRACT

An exposure device is adapted to intermittently feed a metal strip with each surface coated with a photosensitive film and expose it from both sides when the metal strip stops its movement. The device includes a feed setting mechanism comprising a detection roller rotated in accordance with the movement of the metal strip, a detection bar longitudinally movable by the movement of the detection roller, and a switch actuated, when the detection bar is moved a predetermined amount, to stop the movement of the metal strip.

11 Claims, 9 Drawing Figures

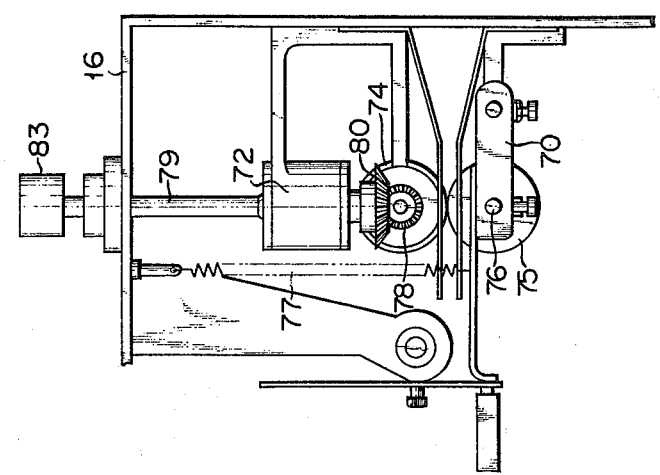
FIG. 6
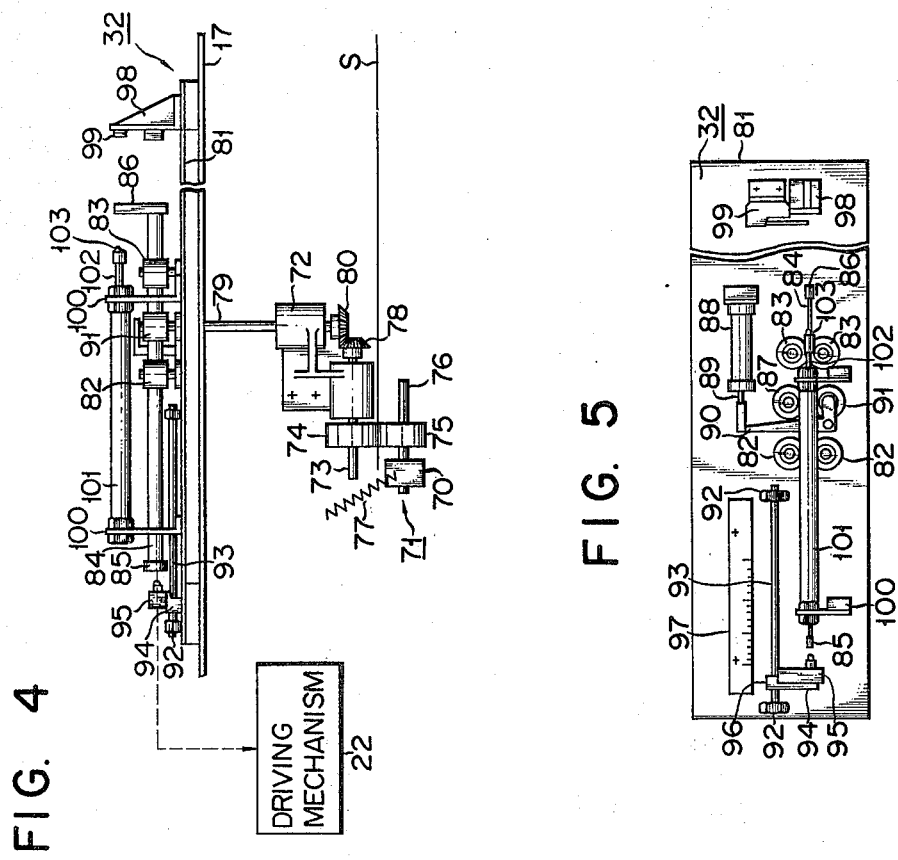
FIG. 4
FIG. 5

EXPOSURE DEVICE

BACKGROUND OF THE INVENTION

This invention relates to an exposure device for intermittently feeding a strip-like article a predetermined amount and sequentially exposing it, and in particular an exposure device having a mechanism for setting the feed of the article.

Generally, an aperture mask (shadow mask) for a color cathode ray tube is manufactured by a photoetching method. The photoetching method broadly comprises four steps: a step for applying a photosensitive coating on each surface of a band iron; a step for exposing each surface of the band iron to print a pattern thereon; a step for developing the pattern on the surface of the band iron; and an etching step. In the exposure step, the pattern on the negative plate is sequentially printed on each surface of the band iron, and a cycle of the feeding of the band iron a predetermined amount, attaching of the negative plate under suction onto each surface of the band iron, exposing the surfaces of the band iron by light sources, and moving of the negative plates away from the band iron are repeated at an interval of 150 to 180 seconds. The feeding of the band iron is effected by winding around a winder the band iron fed through an exposure mechanism from an unwinder on which the band iron is wound.

To intermittently feed the band iron a predetermined amount there will be required a feed setting mechanism adapted to detect the feed of the band iron and move it a predetermined amount.

As the feed mechanism of this type there is known, for example, one in which a detection roller is held in contact with a band iron to cause the former to be rotated according to the movement of the latter, a cam is rotated through an interlocking gear mechanism by the rotation of the detection roller, and a switch is operated through the cam to stop the winding operation of the band iron, thereby attaining the intermittent cyclic movement of the band iron. Where, in this case, it is desired to change the feed of the band iron, a gear in the interlocking gear mechanism is replaced by another gear so that a different gear ratio can be obtained. It is, however, very difficult to effect a gear exchange and it is impossible to change the feed of the band iron into a stepless mode. Furthermore, a feed accuracy of at least ±5 mm is merely attained due to the defects, such as backlash etc., of the interlocking gear mechanism per se, thus failing to attain a more accurate feed required.

SUMMARY OF THE INVENTION

It is accordingly the object of this invention to provide an exposure device capable of changing the feed of a strip-like article by a simple operation into a stepless mode and capable of intermittently feeding the article accurately a predetermined amount.

BRIEF DESCRIPTION OF THE DRAWING

FIG. 4 is a side view showing a feed setting mechanism of the device of FIG. 1;

FIG. 5 is a plan view of the feed setting mechanism of FIG. 4;

FIG. 6 is an enlarged side view showing a detection roller of the feed setting mechanism and its connecting mechanism;

DETAILED DESCRIPTION OF THE PREFERRED EMBODIMENTS

There will now be explained by reference to the accompanying drawings an exposure device according to one embodiment of this invention which is used in an exposure step in a method for photoetching an aperture mask for a color TV cathode ray tube.

Figure 1:
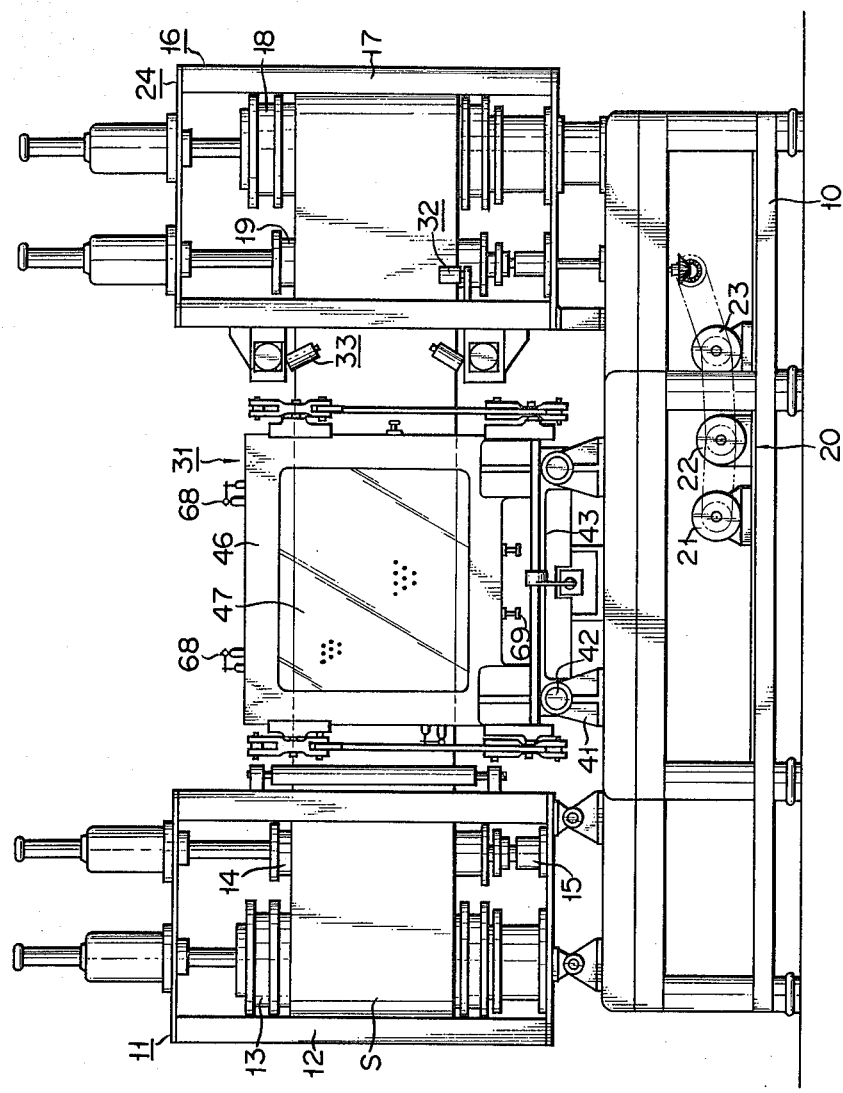
FIG. 1 is a front view showing an exposure device according to an embodiment of this invention.

In FIG. 1 generally showing an exposure device, an unwinder 11 is disposed on one side of the upper surface of a base frame 10 and includes a station frame 12 mounted on the base frame 10, and stations 13 and 14 rotatably mounted on the frame 12 in a side-by-side relation to each other, the station 13 having on its outer surface a band iron wound with an interleaving paper web for protecting a photosensitive film formed on the band iron. An electromagnetic brake 15 is operatively connected through a chain to the station 13. As a result, any excessive rotation of the station 13 is restricted by the electromagnetic brake 15. When the station 14 is rotated in interlock with the station 13, the band iron on the station 13 is unwound, together with the paper web, and delivered toward the station 14 where the paper web only is wound.

On the other side of the upper surface of the base frame 10, a winder 16 is disposed at a predetermined interval from the unwinder 11. The winder 16 includes a frame 17 fixed on the base frame 10, and stations 18 and 19 rotatably mounted on the frame 17. The station 18 is adapted to take up the band iron from the station 13 and the station 19 is adapted to deliver a photosensitive film protecting paper web as an interleaving paper for the band iron. The stations 18 and 19 are operatively connected to a drive mechanism 20 so as to be rotated in synchronism with each other. In this embodiment, the drive mechanism 20 is connected through a chain to the station 19 which is operatively connected through a chain to the station 18. The drive mechanism 20 comprises an electric motor 21, clutch-brake combination member 22, and speed reduction device 23. The unwinder 11 and winder 16 constitute a band iron transmitting device 24.

An exposure mechanism 31 is disposed on the middle section of the base frame 10, i.e. between the unwinder 11 and the winder 16. On the frame 17 of the winder 16 are mounted a feed setting mechanism 32 and position regulating mechanism 33. The operation of the exposure device will be briefly explained below.

A band iron S bearing a photosensitive film on each surface is wound, with a photosensitive film protecting paper web as an interleaving paper, around the outer surface of the station 13 in the unwinder 11. The forward end of the band iron S is passed through the exposure device 31 to the take-up station 18 and connected to it. The leading edge of the paper web is attached to the take-up winder 14. The leading edge of another photosensitive film protecting paper web wound around the winder 19 is inserted and fixed between the turn of the band iron and the take-up station 18. The band iron is intermittently fed, at a rate of a predetermined length, through the exposure mechanism 31 toward the take-up station 18 by means of the drive mechanism 20 which is controlled by the feed setting mechanism 32. While the band iron is intermittently stopped, a pattern is printed through the exposure mechanism 31 on each surface of the band iron S. Where the band iron is displaced, during the intermittent movement, from a correct route, it is regulated to a correct position by the position regulating device 33.

Figure 2:
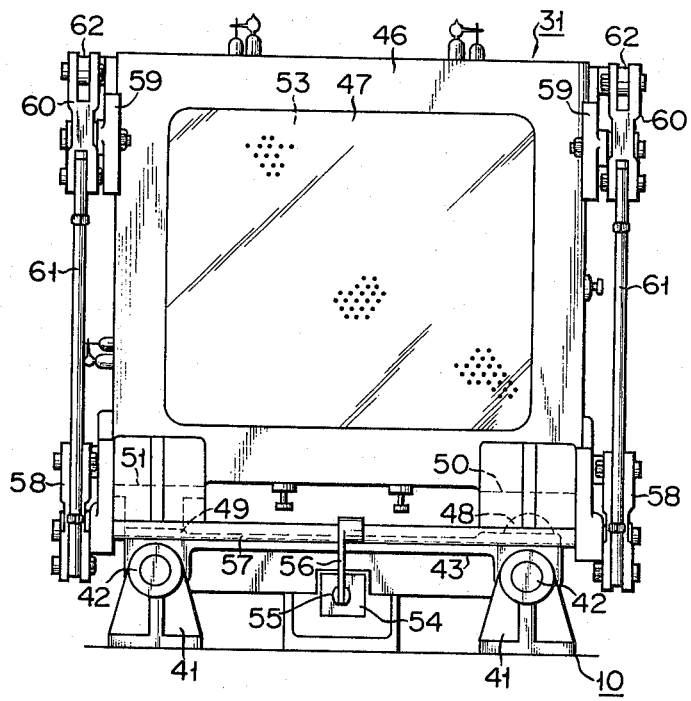
FIG. 2 is an enlarged front view showing the exposure mechanism of FIG. 1.
Figure 3:
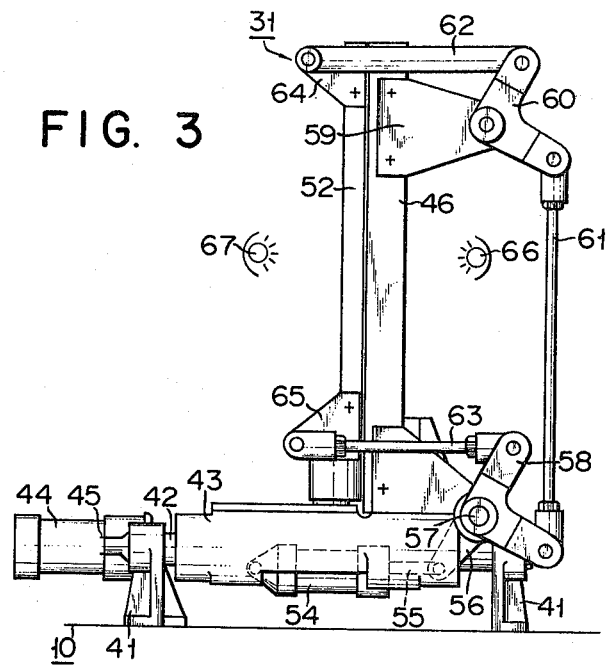
FIG. 3 is a side view of the exposure mechanism of FIG. 2.

The exposure mechanism 31 will be further explained more in detail by referring to FIGS. 1 to 3 conjointly.

On the base frame 10 are disposed two pairs of support bases 41 with one pair at the unwinder side and the other pair at the winder side of the exposure mechanism 31. The paired support bases 41 are disposed at a predetermined interval in the band iron feed direction. A support rod 42 has front and rear ends supported by the front and rear support bases 41 of each pair, respectively. A base 43 is supported on both support rods 42 so as to be movable axially i.e. in the front and back directions of the exposing mechanism 31. To the base 43 is connected a piston rod 45 of an air cylinder 44 fixed to the frame 10.

On the front side of the upper surface of the base 43 is upright mounted a rectangular-shaped exposure frame 46 on which is attached a known negative plate 47 bearing a pattern. A half-circular cross section guide 48 is formed on one side of the upper surface of the base 43 and extends in the front and rear directions of the exposure mechanism 31. A flat guide 49 is formed on the other side of the upper surface of the base 43. Movable blocks 50 and 51 are slidably disposed on the guides 48 and 49, respectively and a movable exposure frame 52 is mounted upright on the movable blocks 50 and 51 in a parallel relation to the basic exposure frame 46. As a result, the movable exposure frame 52 can be moved toward and away from the other exposure frame 46. A negative plate 53 bearing a pattern is also attached on the movable exposure frame 52.

The base portion of an air cylinder 54 is attached to the middle lower surface of the base 43. A piston rod 55 of the air cylinder 54 extends in the front direction of the exposure mechanism 31 and a lever 56 has one end pivoted to the extending end of the piston rod 55, and the other end fixed on the middle of a rotatable shaft 57 which is journaled in the base 43 so as to extend along the front side of the exposure mechanism 31. The middle section of a bell crank 58 is fixed to each end of the rotatable shaft 57, and the middle section of another bell crank 60 is mounted on each side of the upper portion of the basic exposure frame 46 in a manner to be pivotally supported through a support bracket 59. A vertical interlocking rod 61 is pivoted at one end to the lower arm of the upper bell crank 60 and at the other end to the lower arm of the lower bell crank 58. A connecting rod 62 has one end pivoted at a support bracket 64, mounted on each side of the upper portion of the movable exposure frame 52, while a connecting rod 63 has one end rotatably connected to a support bracket 65 fixed on each side of the lower portion of the movable exposure frame 52. The other ends of the connecting rods 62 and 63 are pivoted to the upper arms of the bell cranks 60 and 58, respectively. Exposure light sources 66 and 67 such as mercury discharge lamps are disposed, at predetermined intervals, one outside of the basic exposure frame 46 and the other outside of the movable exposure frame 52 and supported on known support mechanisms not shown, respectively.

A detector 68 for detecting the up and down displacement as well as the lateral displacement of the negative plate is provided on the upper end portion of the respective movable and basic exposure frames 52 and 46, as shown in FIG. 1, in the exposure mechanism 31 of the exposure device. At the lower end portion of the respective movable and basic exposure frames 52 and 46 is provided an adjusting screw 69 consisting of a micrometer for adjusting the downmovement as well as the lateral movement of the negative plate.

The operation of the exposure mechanism 31 will be described below.

After that portion of the band iron sandwiched between the exposure frames 46 and 52 is subject to exposure, one cylinder 54 is first operated and then the other cylinder 44 is operated. That is, the operation of the cylinder 54 causes its piston rod 55 to be advanced, causing the movable exposure frame 52 to be moved away from the band iron through the lever 56, rotatable shaft 57, lower bell crank 58 and connecting rod 63 and through the lower bell crank 58, connecting rod 61, upper crank 60 and connecting rod 62. On the other hand, the operation of the cylinder 44 causes its piston rod 45 to be advanced to permit the basic exposure frame 46 to be moved away from the band iron. Then, the band iron S is fed a predetermined length forward to permit the next succeeding unexposed portion to be confronted with respect to the negative plates 47 and 53 of the exposure frames 46 and 52. At this time, the cylinder 44 is first operated and then the cylinder 54 is operated to cause the band iron S to be sandwiched between the movable and fixed exposure frames 52 and 46. The negative plates 47 and 53 of the movable and basic frames 52 and 46 are sucked at vacuum onto the band iron S. The band iron S is then exposed for 25 to 30 seconds by the light sources 66 and 67 and the patterns of the negative plates 47 and 53 are printed onto the surfaces of the band iron S. After the completion of exposure, vacuum is released and the movable and basic exposure frames 52 and 46 are moved away from the band iron S as mentioned above so that the band iron S can make another intermittent advance. Since the movable and basic exposure frames 52 and 46 are thus moved and guided on the base 43, it is possible to reduce a reproducing error to below five-thousandths. Where the negative plates 47 and 53 of the basic and movable exposure frames 46 and 52 are displaced from each other by more than two-hundredths, the detector 68 indicates this amount of displacement and a fine adjustment is made by an adjusting screw 69 so that the negative plates 47 and 53 can be in correct alignment.

The operation of the feed setting device 32 will now be described by referring to FIGS. 4 to 8.

Figure 7:
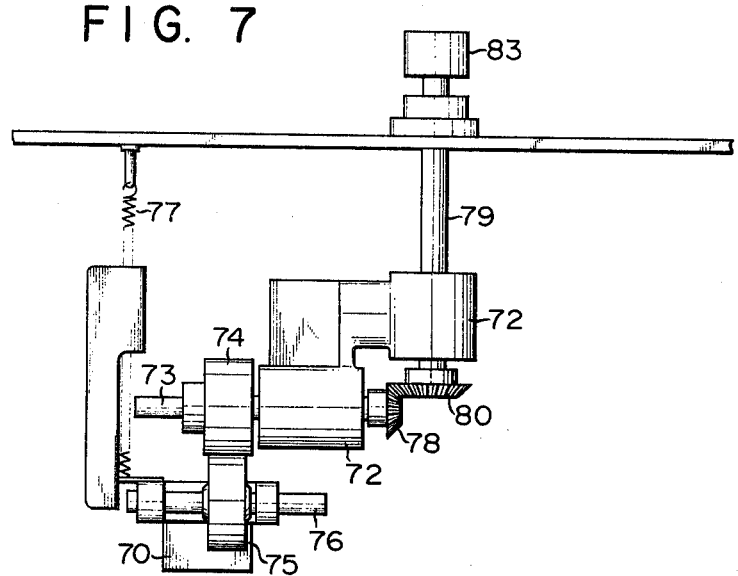
FIG. 7 is a plan view of the mechanisms of FIG. 6.

A detection mechanism 71, as shown schematically in FIG. 4 and more in detail in FIGS. 6 and 7, has a rubber-lined detection roller 74 mounted on one end portion of a rotatable shaft 73 which is journaled in a bearing 72 secured to the frame. The detection roller 74 is positioned opposite to a press roller 75 supported on a rotatable shaft 76 which is journaled in a bearing 70 rotatably mounted on the frame 16. A tension spring 77 fixed at one end is anchored at the other end to the bearing 70 with the result that the press roller 75 is urged against the detection roller 74 and the detection roller 74 is rotated by the movement of the iron band sandwiched between the rollers 74 and 75. On the other end of the rotatable shaft 73 is mounted a bevel gear 78 with which is engaged a bevel gear 80 mounted on one end of a rotatable shaft 79 which is journaled in a bearing 72 in a direction perpendicular to the rotatable shaft 73. A base plate 81 is provided on the frame 17 and two pairs of guide rollers 82 and 83 are rotatably mounted on the base plate 81. A plate-like detection bar 84 is movably supported between the respective pairs of guide rollers 82 and 83 so as to be movable in its longitudinal direction. The detection bar 84 has an actuating piece 85 at one end and an actuating piece 86 at the other end. Against one side surface of the detection bar 84 is abutted a drive roller 87 mounted on the other end of the rotatable shaft 79 which extends through the base plate 81. A press roller 91 is provided on the other side surface of the detection bar 84 so that it may confront the detection bar 84. On the press roller 91 is rotatably mounted one arm of a bell crank 90 whose fulcrum is pivoted to the base plate 81. The other arm of the bell crank 90 is coupled to a piston rod 89 of an air cylinder 88 fixed on the base plate 81. A guide bar 93 is disposed on the base plate 81 in a parallel relation to the detection bar 84 and each end of the guide bar is mounted, through a support 92, on the base plate 81. A switch block 94 is supported on the guide bar 93 so as to be movable along the guide bar 93. On the switch block 94 is mounted a set microswitch 95 adapted to be actuated by the actuating piece 85 on the detection bar 84. A needle 96 projects from one side surface of the switch block 94. A scale plate 97 is mounted on the base plate 81 in a parallel relation to the guide bar 93 and in a manner to confront the needle 96 of the switch block 94. On the side of the actuating piece 86 are provided a stopper 98 for the actuating piece 86 and a set microswitch 99 adapted to be actuated by the actuating piece 86.

A "reset" air cylinder 101 is supported, through a pair of supporters 100, on the base plate 81 in a parallel relation to the detection bar 84. A pressing piece 103 is mounted on the forward end of a piston rod 102 of the air cylinder 101 so that it confronts the actuating piece 86 of the detection bar 84.

There will be explained the operation of the feed setting device 32 after exposure has been completed.

Upon receipt of a signal indicating that the patterns of the negative plates have been printed onto the surfaces of the band iron S, the movable and basic exposure frames 46 and 52 are moved away from the band iron S and the clutch-brake combination member 22 is operated to cause the winder 16 to be driven to permit the winding of the band iron to be started. The movement of the band iron causes the rotation of the detection roller 74 associated with the press roller 75 so as to sandwich the band iron therebetween. When the detection roller 74 is so rotated, the rotation force is transmitted through the rotation shaft 73 and bevel gear 78 to the bevel gear 80 and then through the rotatable shaft 79 to the drive roller 87. The rotation of the drive roller 87 causes the detection bar 84 to be moved in a direction indicated by an arrow in FIG. 5, finally causing the actuating piece 85 of the detection bar 84 to actuate the microswitch 95. As a result, the clutch of the clutch-brake combination member 22 is deenergized and at the same time the brake is operated to cause the winder 16 to be stopped, thus stopping the movement of the band iron S. Then, the press cylinder 88 is operated to cause its piston rod 89 to be withdrawn. As a result, the bell crank 90 is swung, causing the press roller 91 to be moved away from the detection bar 84. Upon completion of this operation the reset air cylinder 101 is operated, extending its piston rod 102 and pushing the actuating piece 86 of the detection bar 84 through the push piece 103 on the piston rod 102 with the actuation of the reset microswitch 99 and the consequent resetting of the detection bar 84. Then, the reset air cylinder 101 and press air cylinder 88 are returned to the original position and the reset operation is complete.

Figure 8:
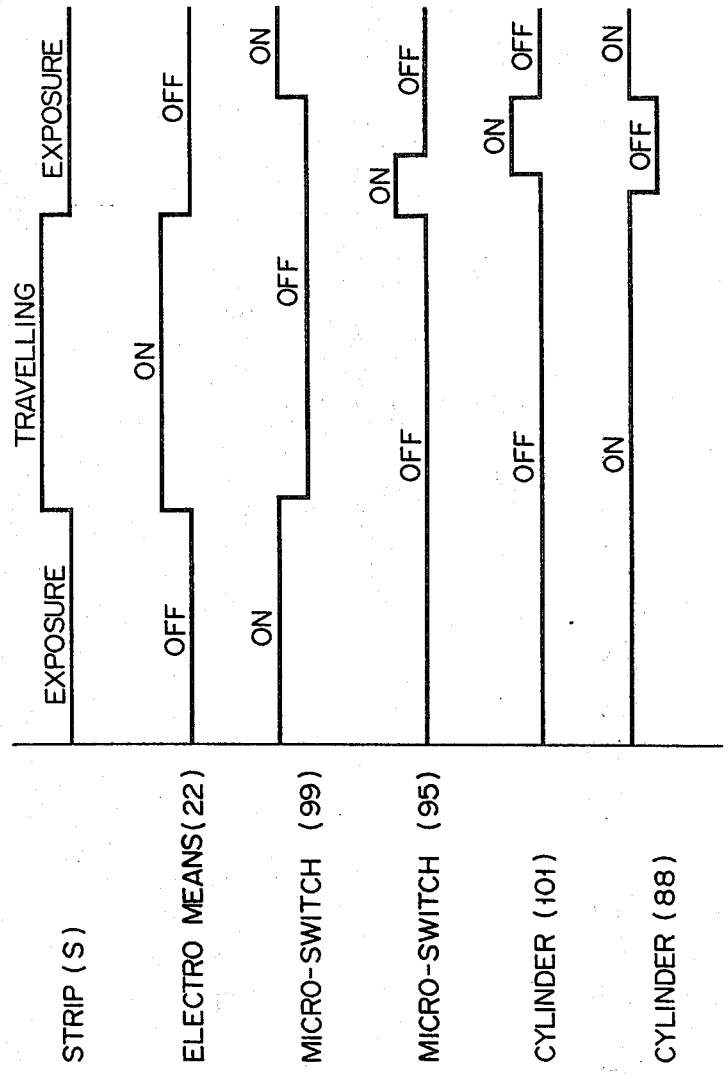
FIG. 8 is a time chart of various parts associated with the feed setting mechanism.

The time relation of the various parts involved in feeding the band iron a predetermined length is shown in FIG. 8.

By moving the switch block 94 along the guide bar 93 and positioning the switch 95 with the needle 96 in a desired position on the scale 97, it is possible to determine each cycle feed of the band iron.

Figure 9:
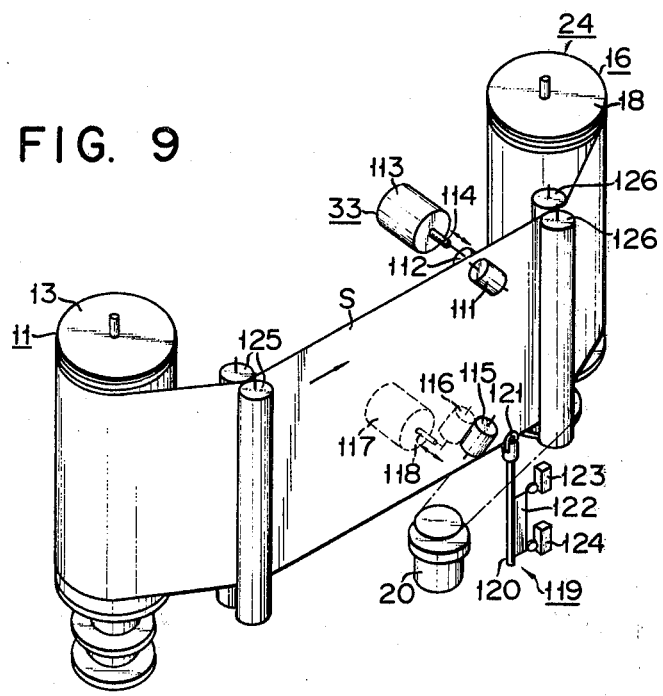
FIG. 9 is a schematic, perspective view showing a mechanism for regulating the position of a strip-like article.

The position regulating mechanism 33 will now be described more in detail by referring to FIG. 9.

Between the unwinder and the winder are disposed at a predetermined interval two pairs of vertical guide rollers 125 and 126. The band iron S is sandwiched between the rollers of each pair. Between both guide rollers 125 and both guide rollers 126 are disposed a pair of upper regulating pinch rollers 111, 112 acting on the upper edge portion of the band iron S and a pair of lower regulating pinch rollers 115, 116 acting on the lower edge portion of the band iron S. The pair of regulating rollers 111, 112 are so disposed that the rotation axes are declined in a direction of movement of the band iron S. The roller 111 is so normally disposed as to be in contact with the band iron S, while the roller 112 is so disposed that it can be moved away from the band iron S. The movement of the roller 112 is selectively made, as a piston rod 114 of an air cylinder 113 is connected to the roller 112. The upper regulating rollers 115 and 116 are so disposed that the rotation axes are declined upward in the direction of movement of the band iron S. The roller 115 is so normally disposed as to be in contact with the band iron S, while the roller 116 is so disposed that it can be moved away from the band iron S by a piston rod 118 of an air cylinder 117.

A position displacement detection mechanism 119 is disposed below the band iron S. The detection mechanism 119 includes an operating rod 120 normally urged upward and movable axially i.e. in an up and down direction, and a detection roller 121 rotatably supported on the upper end of the operating rod 120 and rotatable in abutment with the lower edge of the band iron S. The operating rod 120 has a projecting operating piece 122, and microswitches 123 and 124 adapted to control the air cylinders 113 and 117, respectively, are provided one above the upper portion and one below the lower portion of the operating piece 122.

During the time period in which the band iron S is moved in an ordinary state, i.e. at a predetermined horizontal level, and wound around the winder 16, the operating rod 120 is in a neutral state and the microswitches 123 and 124 are both in the OFF state and thus inoperative. Consequently, both the air cylinders 113 and 117 are inoperative and the movable rollers 112 and 116 are spaced away from the band iron S. Where the iron band S is lowered in its level or inclined downward, the operating rod 120 is pushed down through the detection roller 121 to cause the lower microswitch 124 to be operated through the operating piece 122. The upper cylinder 113 is operated by a signal from the so operated microswitch 124 to cause its piston rod to be extended, urging the press roller 112 against the fixed roller 111 so that the band iron S is sandwiched between the fixed roller 111 and the press roller 112. Since the fixed roller 111 and press roller 112 are mounted in a manner to be inclined downward in the direction of movement of the band iron S, they impart, during the movement of the band iron S toward the winder 16, an upward force to the band iron S and thus serve to bring the band iron S back into the original correct level. Where, on the other hand, the level of the band iron S is raised, the operating rod 120 is pushed upward through the detection roller 121 from its neutral position to cause the upper microswitch 123 to be operated through the operating piece 122. By a signal from the so operated microswitch 123, the lower cylinder 117 is operated to cause its piston rod 118 to be extended, urging the press roller 116 against the fixed roller 115 so that the band iron S is sandwiched between the rollers 115 and 116. Since the pair of rollers 115 and 116 are mounted in a manner to be inclined upward in the direction of movement of the band iron S, they serve to bring the band iron S back into the original correct level.

The following is one practical embodiment of the position regulating mechanism 33.

Use was made of the rollers 111, 112, 115 and 116 each of which is 30 mm in diameter and 30 mm in length and the rubber lining was designed to have a hardness of 90 to 93. The paired rollers 111, 112 and 115, 116 were disposed at an angle of about 2° in the direction of movement of the band iron so that one pair of rollers 111, 112 are symmetrical to the other pair of rollers 115, 116 as shown in FIG. 6. When a pressure of 4 kg/cm² is supplied to the cylinders 113 and 117 so as to bring the rollers 112 and 116 into pressure contact with the rollers 111 and 115, the variation of the level at which the band iron S is wound around the winder was below 10 mm.

What we claim is:

1. An exposure device comprising a transport mechanism for transporting a strip-like article in its longitudinal direction, a feed setting mechanism for operating said transport mechanism to cause the article to be intermittently moved at a predetermined interval, and an exposure mechanism disposed midway of a transport path to expose the predetermined surface portion of the article, in which said feed setting mechanism comprises detection means having a detection roller engaged with the article and rotated as the article is transported, a detection bar adapted to be longitudinally moved from a first position to a second position according to the rotation of the detection roller, a switch operative, when said detection bar is moved to the second position, to stop the movement of the article, means for determining said second position of said detection bar, and means for returning said detection bar back into said first position, in which the intermittent feed distance of the article is determined by the movement of the detection bar.

2. An exposure device according to claim 1, in which said detection mechanism comprises a press roller associated with said detection roller to sandwich the article therebetween, a spring for urging the press roller against the detection roller, a drive roller adapted to be engaged with said detection bar and a transmission mechanism for transmitting a rotation force of said detection roller to said drive roller.

3. An exposure device according to claim 2, in which said detection mechanism further includes a movable press roller adapted to be engageable with said detection bar and, when it is engaged with said detection bar, be associated with said drive roller to sandwich said detection bar therebetween.

4. An exposure device according to claim 3, in which said return means includes first and second air cylinders actuated after the operation of said switch, said first air cylinder being operated by said switch to move said press roller away from said detection bar and said second air cylinder being operated by said switch to move said detection bar back into said first position.

5. An exposure device according to claim 1, in which said switch is a switch adapted to be operated when said switch is engaged with one end of said detection bar, and said determining means includes a block selectively movable in the longitudinal direction of said detection bar and having a switch mounted thereon.

6. An exposure device according to claim 5, in which said determining means has a scale extending along the direction of movement of said switch block and indicating a position in which said switch block is moved.

7. An exposure device according to claim 1, in which said transport mechanism comprises an unwind station loaded with said article, a wind station mounted at an interval from said station and adapted to pick up said article, and a drive mechanism for rotating said pickup station.

8. An exposure device according to claim 1, in which said exposure mechanism comprises a pair of exposure frames adapted to be spaced apart from each other when said article is moved and sandwiches said article therebetween when said article stops its movement, a pair of negative plates each attached on each of said exposure frames, light sources each provided outside of the respective exposure frame, and means for moving said exposure frames.

9. An exposure device according to claim 8, in which said exposure frame moving means comprises a pair of fixed shafts, a base slidably supported in the axial direction of the fixed shaft and on which one of said exposure frames is mounted upright, an air cylinder for moving said base, a guide mounted on said base and adapted to slidably guide the other of said exposure frame on said base, and means for moving said other exposure frame along said base by applying forces on all four corners of the exposure frame.

10. An exposure device according to claim 1, further including a position regulating mechanism for detecting the variation in level of said article during the transport of said article and bringing said article back into an original position.

11. An exposure device according to claim 10, in which said position regulating means comprises two pairs of rollers, disposed in a manner to be inclined inward in a direction of movement of the article with the outer periphery thereof parallel to the surface level of the article and adapted to sandwich the article, one of said each pair of rollers being movable away from the article, means for detecting the variation in level of the article in transit and means for urging said one of said each pair of rollers against the article.

* * * * *